United States Patent
Cho et al.

(10) Patent No.: US 7,594,160 B2
(45) Date of Patent: Sep. 22, 2009

(54) APPARATUS AND METHOD FOR RECEIVING SIGNAL IN A COMMUNICATION SYSTEM

(75) Inventors: Hyung-Sang Cho, Suwon-si (KR); Yun-Sang Park, Suwon-si (KR); Bong-Gee Song, Seongnam-si (KR)

(73) Assignee: Samsung Electronics Co., Ltd (KR)

( * ) Notice: Subject to any disclaimer, the term of this patent is extended or adjusted under 35 U.S.C. 154(b) by 643 days.

(21) Appl. No.: 11/450,815

(22) Filed: Jun. 9, 2006

(65) Prior Publication Data

US 2007/0011593 A1  Jan. 11, 2007

(30) Foreign Application Priority Data

Jun. 9, 2005  (KR) ...................... 10-2005-0049406

(51) Int. Cl.
*H03M 13/45* (2006.01)
(52) U.S. Cl. ...................... 714/780; 375/340
(58) Field of Classification Search ................. 714/780; 375/340, 341
See application file for complete search history.

(56) References Cited

U.S. PATENT DOCUMENTS

| | | | |
|---|---|---|---|
| 6,782,037 B1 * | 8/2004 | Krishnamoorthy et al. | 375/138 |
| 6,904,097 B2 * | 6/2005 | Agami et al. | 375/261 |
| 6,934,317 B1 * | 8/2005 | Dent | 375/140 |
| 7,139,964 B2 * | 11/2006 | Shen et al. | 714/758 |
| 7,254,167 B2 * | 8/2007 | Lin et al. | 375/224 |
| 7,254,188 B2 * | 8/2007 | Cannon et al. | 375/324 |
| 7,302,012 B2 * | 11/2007 | Kim et al. | 375/316 |
| 7,370,265 B2 * | 5/2008 | Shen et al. | 714/792 |
| 7,406,650 B2 * | 7/2008 | Cameron et al. | 714/780 |
| 7,483,497 B2 * | 1/2009 | Oh et al. | 375/341 |
| 2003/0072395 A1 | 4/2003 | Jia et al. | |
| 2003/0076890 A1 * | 4/2003 | Hochwald et al. | 375/264 |
| 2003/0228850 A1 * | 12/2003 | Hwang | 455/101 |

FOREIGN PATENT DOCUMENTS

| | | |
|---|---|---|
| JP | 2004-096745 | 3/2004 |
| KR | 1020010050871 | 6/2001 |
| KR | 1020040023863 | 3/2004 |

* cited by examiner

*Primary Examiner*—Stephen M Baker
(74) *Attorney, Agent, or Firm*—The Farrell Law Firm, LLP

(57) ABSTRACT

Provided is an apparatus and method for receiving a signal in communication system. The apparatus and method includes generating a particular log-likelihood ratio (LLR) value by demapping an input signal according to a particular demapping scheme among a plurality of demapping schemes; performing a control operation of buffering the particular LLR value in a particular LLR sub-buffer for buffering an LLR value generated according to the particular demapping scheme among the plurality of LLR sub-buffers for buffering an LLR value generated according to each of the plurality of demapping schemes; and performing a control operation of reading an LLR value buffered in an LLR buffer including the plurality of LLR sub-buffers.

30 Claims, 7 Drawing Sheets

APPARATUS AND METHOD FOR RECEIVING SIGNAL IN A COMMUNICATION SYSTEM

PRIORITY

This application claims the benefit under 35 U.S.C. § 119(a) of an application filed in the Korean Intellectual Property Office on Jun. 9, 2005 and assigned Serial No. 2005-49406, the entire contents of which are incorporated herein by reference.

BACKGROUND OF THE INVENTION

1. Field of the Invention

The present invention relates generally to an apparatus and method for receiving signals in a communication system, and in particular, to an apparatus and method for receiving signals by buffering Log-Likelihood Ratio (LLR) values according to a mapping scheme.

2. Description of the Related Art

A signal receiving apparatus of a communication system includes a receiver, a demapper, a deinterleaver, and a decoder. The decoder is realized with a Convolutional Turbo Code (CTC) decoder or a Convolutional Code (CC) decoder. The reason why the decoder is realized with the CTC decoder or the CC decoder is because the communication system can basically use the CC decoder and optionally use the CTC decoder.

A signal transmitting apparatus of the communication system includes an encoder, an interleaver, a mapper, and a transmitter. The encoder is realized with a CTC encoder or a CC encoder. If there are information data bits to transmit in the signal transmitting apparatus, the information data bits are delivered to the encoder. The encoder encodes the information data bits into coded bits according to a preset encoding scheme, and outputs the coded bits to the interleaver. The interleaver interleaves the coded bits according to a preset interleaving scheme, and outputs the interleaved bits to the mapper. The mapper maps the signal output from the interleaver according to a preset mapping scheme, and outputs the mapped signal to the transmitter. The transmitter performs a transmission process on the signal output from the mapper, and transmits the signal to the signal receiving apparatus.

To recover the information data bits in the signal receiving apparatus, the receiver performs a reception process on a received signal, and outputs the signal to the demapper. The demapper demaps the signal output from the receiver according to a demapping scheme corresponding to the mapping scheme used in the mapper, and outputs the demapped signal to the deinterleaver. It is assumed herein that the demapper uses an LLR scheme. The deinterleaver deinterleaves the signal output from the demapper according to a deinterleaving scheme corresponding to the interleaving scheme used in the interleaver, and outputs the deinterleaved signal to the decoder. The decoder decodes the signal output from the deinterleaver according to a decoding scheme corresponding to the encoding scheme used in the encoder to restore the received signal to its original information data bits. Because the demapper uses the LLR scheme as stated above, the signal output from the demapper, i.e., the LLR values, should be buffered in a buffer before being deinterleaved in the deinterleaver. Because a buffering operation of the LLR values may considerably affect the performance of the communication system, the buffer must be designed to take into account a delay time caused by the buffering of the LLR values. In addition, the buffer should be designed to take into account not only the delay time but also the size and cost of the signal receiving apparatus.

Currently, however, there is no proposed operation and structure of a buffer for buffering the LLR values in the BWA communication system. Accordingly, there is a need for a scheme of receiving signals by buffering LLR values in the BWA communication system.

SUMMARY OF THE INVENTION

It is, therefore, an object of the present invention to provide an apparatus and method for receiving signals in a Broadband Wireless Access (BWA) communication system.

It is another object of the present invention to provide an apparatus and method for receiving signals by buffering LLR values according to a mapping scheme in a BWA communication system.

According to one aspect of the present invention, there is provided an apparatus for receiving a signal in a communication system. The apparatus includes a log-likelihood ratio (LLR) buffer with a plurality of LLR sub-buffers, for buffering an LLR value generated according to each of a plurality of demapping schemes; an LLR demapper for generating a particular LLR value by demapping an input signal according to a particular demapping scheme among the plurality of demapping schemes; an LLR buffer write controller for performing a control operation of buffering the particular LLR value in a particular LLR sub-buffer for buffering an LLR value generated according to the particular demapping scheme among the plurality of LLR sub-buffers; and an LLR buffer read controller for performing a control operation of reading an LLR value buffered in the LLR buffer.

According to another aspect of the present invention, there is provided a method for receiving a signal in a broadband wireless access (BWA) communication system. The method includes generating a particular log-likelihood ratio (LLR) value by demapping an input signal according to a particular demapping scheme among a plurality of demapping schemes; performing a control operation of buffering the particular LLR value in a particular LLR sub-buffer indicative of an LLR sub-buffer for buffering an LLR value generated according to the particular demapping scheme among the plurality of LLR sub-buffers for buffering an LLR value generated according to each of the plurality of demapping schemes; and performing a control operation of reading an LLR value buffered in an LLR buffer including the plurality of LLR sub-buffers.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

Figure 1:
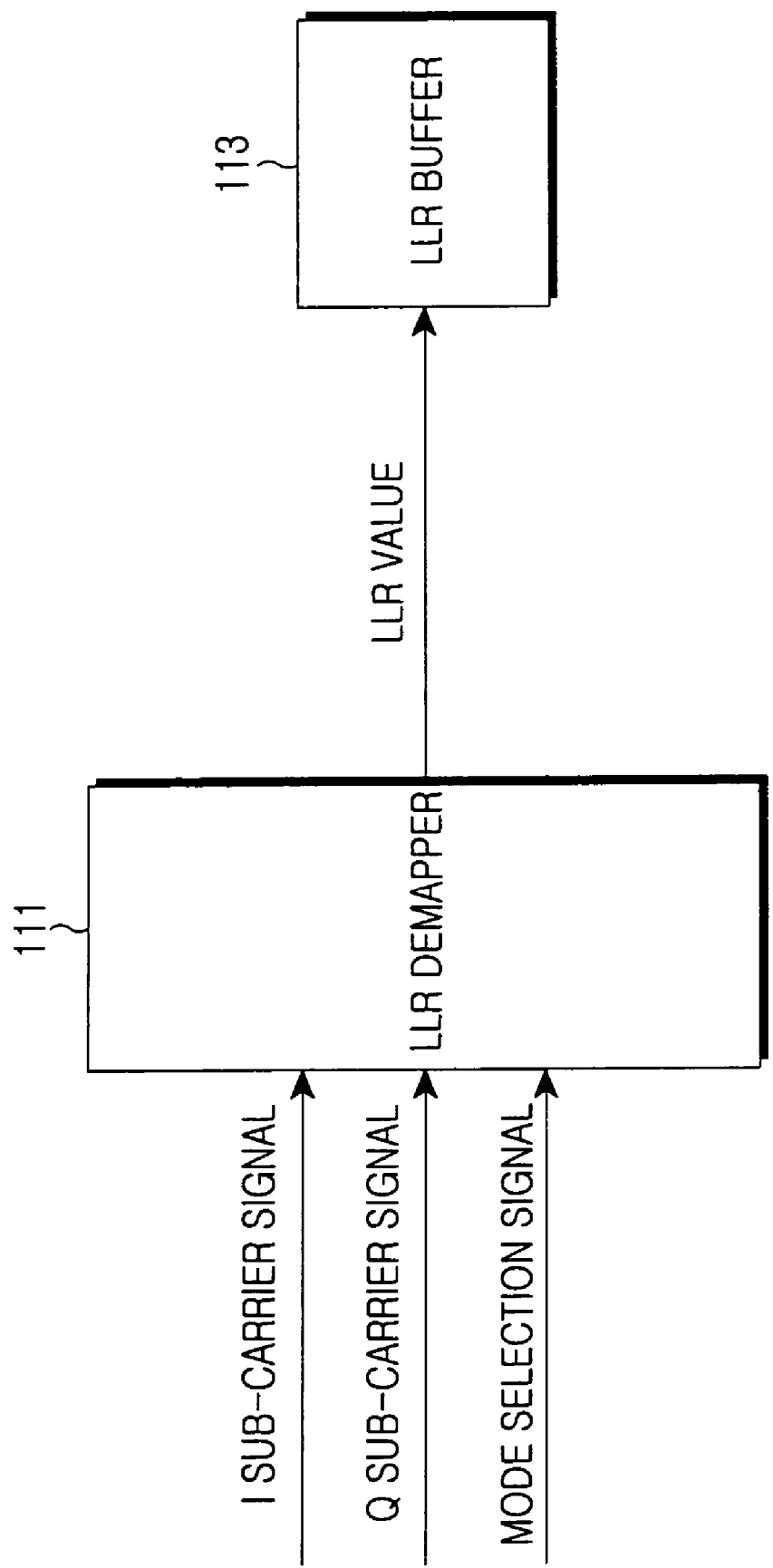
FIG. 1 is a diagram illustrating an internal structure of a signal receiving apparatus in a communication system according to a first embodiment of the present invention.

FIG. 1 is a diagram illustrating an internal structure of a signal receiving apparatus in a communication system according to a first embodiment of the present invention.

Referring to FIG. 1, the signal receiving apparatus includes a receiver (not shown), a Log-Likelihood Ratio (LLR) demapper 111, an LLR buffer 113, a deinterleaver (not shown), and a decoder (not shown). The decoder is realized with a Convolutional Turbo Code (CTC) decoder or a Convolutional Code (CC) decoder. The communication system can basically use the CC decoder and optionally use the CTC decoder. A signal received at the signal receiving apparatus is delivered to the receiver, and the receiver performs a reception process on the received signal, and outputs the signal to the LLR demapper 111. The signal output from the receiver includes an in-phase (I) sub-carrier signal and a quadrature-phase (Q) sub-carrier signal. The LLR demapper 111 preferably uses an LLR scheme. The LLR demapper 111 is provided with a mode selection signal. The mode selection signal is a signal for selecting a demapping scheme to be used by the LLR demapper 111. Specifically, the mode selection signal is a signal for selecting a demapping scheme corresponding to the mapping scheme used in a mapper of a signal transmitting apparatus associated with the signal receiving apparatus. For example, if the mapping scheme used in the mapper is any one of Quadrature Phase Shift Keying (QPSK), 16-ary Quadrature Amplitude Modulation (16QAM) and 64QAM, the mode selection signal selects any one of a demapping scheme corresponding to QPSK, a demapping scheme corresponding to 16QAM, and a demapping scheme corresponding to 64QAM. The LLR demapper 111 demaps the I sub-carrier signal and the Q sub-carrier signal according to a demapping scheme selected depending on the mode selection signal, and outputs their LLR values to the LLR buffer 113.

For convenience, the operation of selecting a demapping scheme depending on the mode selection signal may be referred to as an operation of 'performing mode switching'. In addition, the demapping scheme corresponding to QPSK will referred to as a 'first demapping scheme', the demapping scheme corresponding to 16QAM will referred to as a 'second demapping scheme', and the demapping scheme corresponding to 64QAM will referred to as a 'third demapping scheme'. When the LLR demapper 111 uses the first demapping scheme, no delay occurs. When the LLR demapper 111 uses the second demapping scheme, a 1-clock delay occurs. When the LLR demapper 111 uses the third demapping scheme, a 2-clock delay occurs. Herein, the term "delay" refers to a time required for buffering the LLR values calculated by the LLR demapper 111 in the LLR buffer 113. The delay occurs for the following reasons. Because the I sub-carrier signal and the Q sub-carrier signal are simultaneously input to the LLR demapper 111, the LLR demapper 111 calculates an LLR value for each of the I sub-carrier signal and the Q sub-carrier signal, and outputs a different number of LLR values according to its demapping scheme. The LLR demapper 111, when it uses the first demapping scheme as its demapping scheme, outputs 1 LLR value for each of the I sub-carrier signal and the Q sub-carrier signal. The LLR demapper 111, when it uses the second demapping scheme as its demapping scheme, outputs 2 LLR values for each of the I sub-carrier signal and the Q sub-carrier signal. The LLR demapper 111, when it uses the third demapping scheme as its demapping scheme, outputs 3 LLR values for each of the I sub-carrier signal and the Q sub-carrier signal. That is, the LLR demapper 111 outputs 2-bit LLR values for the first demapping scheme, outputs 4-bit LLR values for the second demapping scheme, and 6-bit LLR values for the third demapping scheme. As a result, the LLR demapper 111 performs calculation on the LLR values after a lapse of every delay time.

The signal receiving apparatus illustrated in FIG. 1 is designed to permit occurrence of the delay caused by the LLR value calculation, contributing to minimization of a size of the LLR buffer 113. However, when the third demapping scheme is primarily used, the full processing speed of the signal receiving apparatus decreases due to the delay caused by the demapping based on the third demapping scheme. For example, for an Institute of Electrical and Electronics Engineers (IEEE) 802.16e communication system, which one of the typical communication systems, if it is assumed that in a Partial Usage of Sub-Channels (PUSC) symbol format, which is a basic frame format, the number of data sub-carriers in one symbol is 720 and the number of received symbols in one frame is 25, then the number of sub-carriers whose LLR values should be calculated in a one-frame interval is 18000. Assuming that a signal received through 10000 sub-carriers among the 18000 sub-carriers is a signal mapped using 64QAM, a delay of a total of 20000 clocks occurs. As a result, a delay of about two symbols occurs in the storing process of the LLR buffer 113. This figure can considerably reduce the overall performance of the IEEE 802.16e communication system, and in order to obtain a higher data rate, the number of decoders should increase to increase a decoding rate. Therefore, the delay inevitably causes an increase in the number of decoders and a loss of the data rate.

In order to prevent the delay occurring when the LLR values are buffered in an LLR buffer, it is possible to separately design LLR buffers according to demapping schemes used therein, and a description thereof will be made with reference to FIG. 2.

Figure 2:
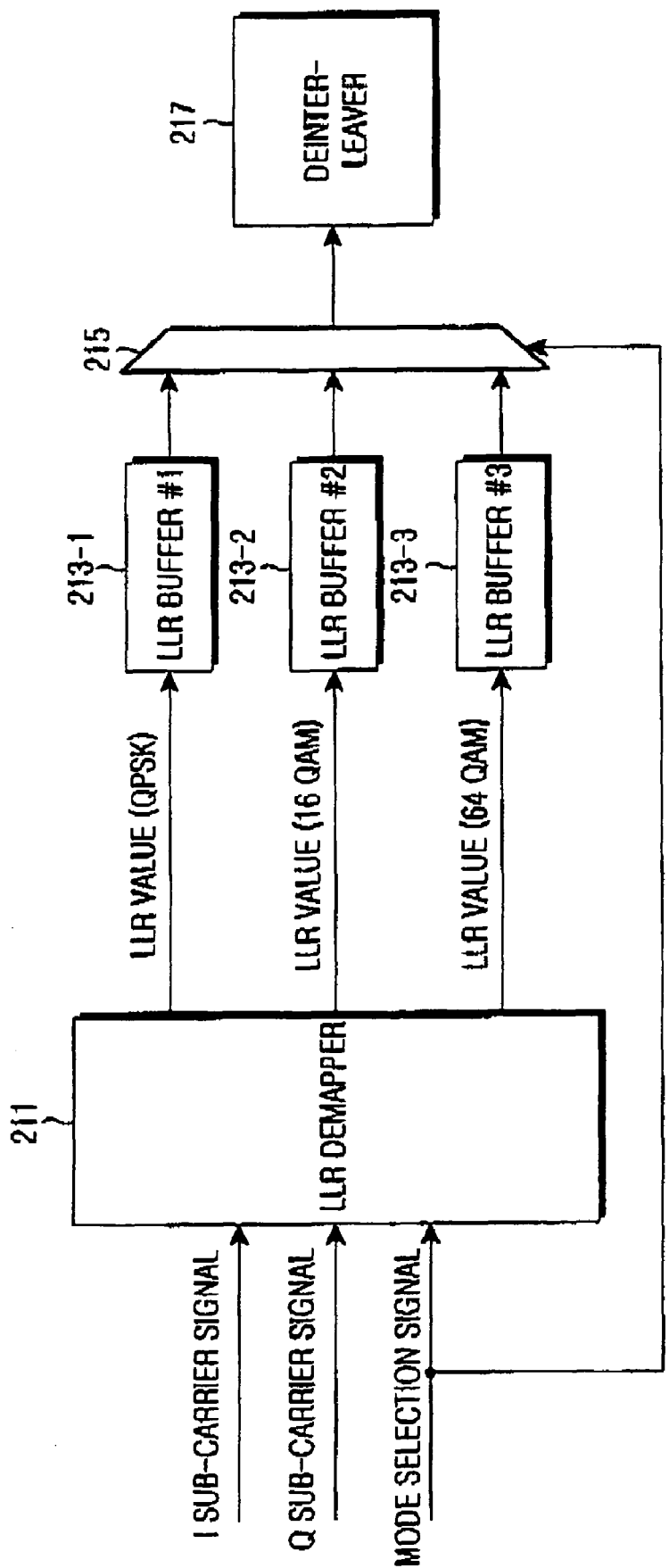
FIG. 2 is a diagram illustrating an internal structure of a signal receiving apparatus in a communication system according to a second embodiment of the present invention.

FIG. 2 is a diagram illustrating an internal structure of a signal receiving apparatus in a communication system according to a second embodiment of the present invention.

Referring to FIG. 2, the signal receiving apparatus includes a receiver (not shown), an LLR demapper 211, a plurality of, for example, 3 LLR buffers including an LLR buffer #1 213-1, an LLR buffer #2 213-2, and an LLR buffer #3 213-3, a switch 215, a deinterleaver 217, and a decoder (not shown). The receiver and the deinterleaver are similar in operation to those described in connection with FIG. 1, so a detailed description thereof will be omitted herein. The LLR demapper 211, provided with a mode selection signal, demaps the signal output from the receiver according to the mode selection signal, and outputs LLR values. The mode selection signal is similar to that described in connection with FIG. 1. If the mode selection signal indicates a first demapping scheme, the LLR demapper 211 demaps the signal output from the receiver according to the first demapping scheme, and outputs its LLR values to the LLR buffer #1 213-1. If the mode selection signal indicates a second demapping scheme, the LLR demapper 211 demaps the signal output from the receiver according to the second demapping scheme, and outputs its LLR values to the LLR buffer #2 213-2. If the mode selection signal indicates a third demapping scheme, the LLR demapper 211 demaps the signal output from the receiver according to the third demapping scheme, and outputs its LLR values to the LLR buffer #3 213-3. The switch 215, also provided with the mode selection signal, outputs the LLR values output from any one of the LLR buffer #1 213-1 to the LLR buffer #3 213-3 to the deinterleaver 217 according to the mode selection signal. The signal receiving apparatus illustrated in FIG. 2 separately realizes LLR buffers according to demapping schemes thereof, thereby preventing the delay occurring when LLR values are buffered in an LLR buffer due to the difference of the demapping schemes. However, because the signal receiving apparatus illustrated in FIG. 2 increases the required buffer size, a structure of a new signal receiving apparatus capable of preventing the delay occurring when the LLR values are buffered in the LLR buffer and also preventing the increase in the buffer size will be described with reference to FIG. 3.

Figure 3:
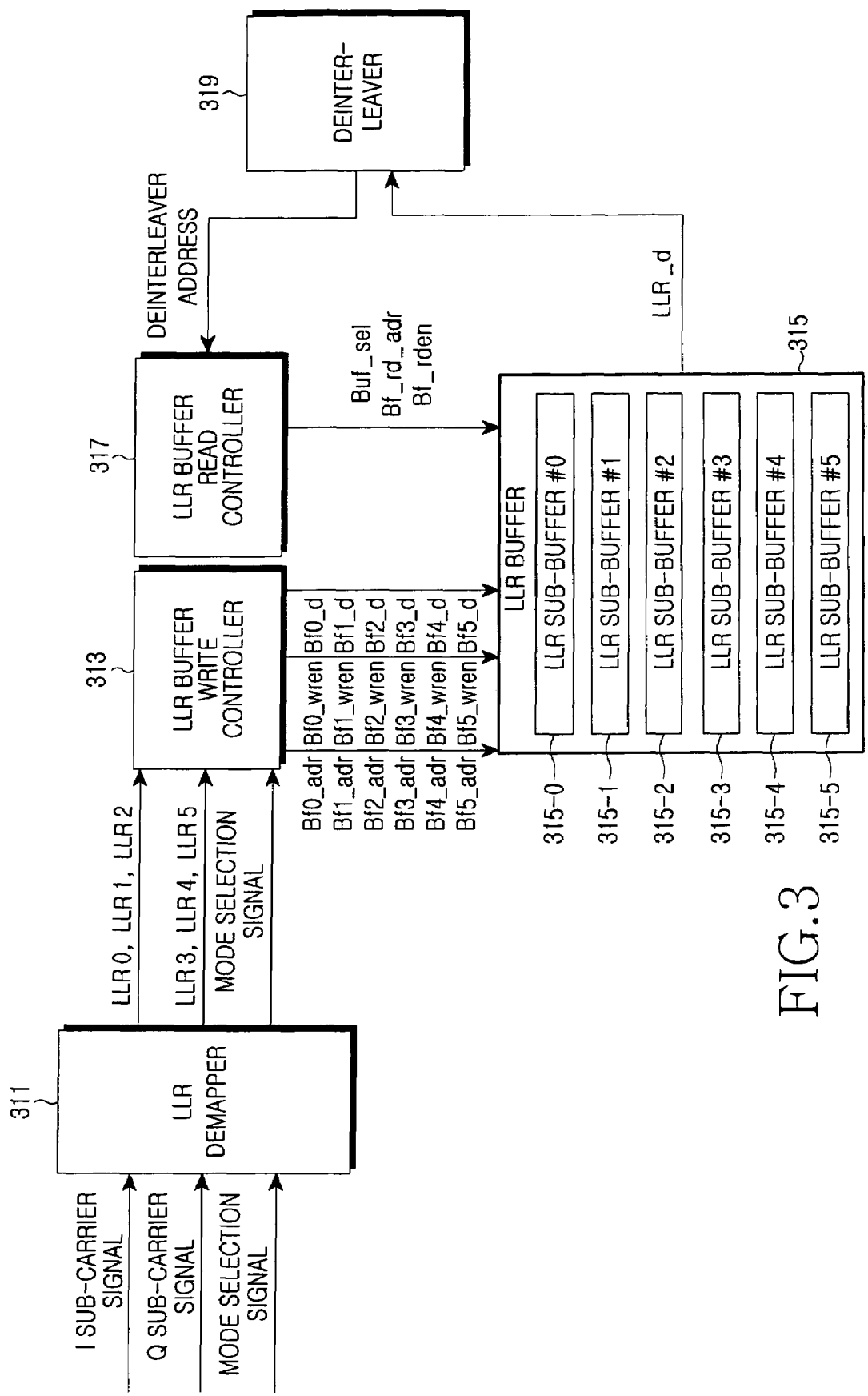
FIG. 3 is a diagram illustrating an internal structure of a signal receiving apparatus in a communication system according to a third embodiment of the present invention.

FIG. 3 is a diagram illustrating an internal structure of a signal receiving apparatus in a communication system according to a third embodiment of the present invention.

Referring to FIG. 3, the signal receiving apparatus includes a receiver (not shown), an LLR demapper 311, an LLR buffer write controller 313, an LLR buffer 315, an LLR buffer read controller 317, and a deinterleaver 319. The LLR buffer 315 includes a plurality of, for example, 6 LLR sub-buffers including an LLR sub-buffer #0 315-0, an LLR sub-buffer #1 315-1, an LLR sub-buffer #2 315-2, an LLR sub-buffer #3 315-3, an LLR sub-buffer #4 315-4, and an LLR sub-buffer #5 315-5. The receiver and the deinterleaver are similar in operation to those described in connection with FIG. 1, so a detailed description thereof will be omitted herein. The LLR demapper 311, provided with a mode selection signal, demaps the signal output from the receiver according to the mode selection signal, and outputs LLR values. The mode selection signal is similar to that described in connection with FIG. 1. If the mode selection signal indicates a first demapping scheme, the LLR demapper 311 demaps the signal output from the receiver according to the first demapping scheme, and outputs its LLR values to the LLR buffer write controller 313. If the mode selection signal indicates a second demapping scheme, the LLR demapper 311 demaps the signal output from the receiver according to the second demapping scheme, and outputs its LLR values to the LLR buffer write controller 313. If the mode selection signal indicates a third demapping scheme, the LLR demapper 311 demaps the signal output from the receiver according to the third demapping scheme, and outputs its LLR values to the LLR buffer write controller 313. In FIG. 3, LLR values for the I sub-carrier signal and the Q sub-carrier signal output when the LLR demapper 311 uses the first demapping scheme, are shown by LLR0 and LLR3; LLR values for the I sub-carrier signal and the Q sub-carrier signal output when the LLR demapper 311 uses the second demapping scheme, are shown by LLR0, LLR1, LLR3 and LLR4; and LLR values for the I sub-carrier signal and the Q sub-carrier signal output when the LLR demapper 311 uses the third demapping scheme, are shown by LLR0, LLR1, LLR2, LLR3, LLR4, and LLR5. In addition, the LLR demapper 311 outputs the provided intact mode selection signal to the LLR buffer write controller 313. The LLR buffer write controller 313 buffers the LLR values output from the LLR demapper 311 in the LLR buffer 315 according to the mode selection signal. The reason why the LLR buffer 315 includes 6 LLR sub-buffers is because the IEEE 802.16e communication system sets a size of an LLR buffer to a multiple of 6. For example, when the decoder is realized with a CC decoder, a size of the LLR buffer 315 is 576, and when the decoder is realized with a CTC decoder, the size of the LLR buffer 315 is 960. Therefore, when the decoder is realized with the CC decoder, the size of each of the LLR sub-buffers 315-0 to 315-5 is 96, and when the decoder is realized with the CTC decoder, the size of each of the LLR sub-buffers 315-0 to 315-5 is 160.

The LLR buffer write controller 313 generates corresponding LLR sub-buffer addresses Bf0_adr, Bf1_adr, Bf2_adr, Bf3_adr, Bf4_adr, and Bf5_adr for separately buffering the corresponding LLR values output from the LLR demapper 311 in the LLR sub-buffers 315-0 to 315-5, signals Bf0_wren, Bf1_wren, Bf2_wren, Bf3_wren, Bf4_wren, and Bf5_wren for write-enabling the corresponding LLR sub-buffers, and LLR values Bf0_d, Bf1_d, Bf2_d, Bf3_d, Bf4_d, and Bf5_d to be actually buffered. Bf0_adr indicates an address for writing an LLR value in the LLR sub-buffer #0 315-0, Bf1_adr indicates an address for writing an LLR value in the LLR sub-buffer #1 315-1, Bf2_adr indicates an address for writing an LLR value in the LLR sub-buffer #2 315-2, Bf3_adr indicates an address for writing an LLR value in the LLR sub-buffer #3 315-3, Bf4_adr indicates an address for writing an LLR value in the LLR sub-buffer #4 315-4, and Bf5_adr indicates an address for writing an LLR value in the LLR sub-buffer #5 315-5.

Bf0_wren is a signal for enabling the LLR sub-buffer #0 315-0 to write an LLR value, Bf1_wren is a signal for enabling the LLR sub-buffer #1 315-1 to write an LLR value, Bf2_wren is a signal for enabling the LLR sub-buffer #2 315-2 to write an LLR value, Bf3_wren is a signal for enabling the LLR sub-buffer #3 315-3 to write an LLR value, Bf4_wren is a signal for enabling the LLR sub-buffer #4 315-4 to write an LLR value, and Bf5_wren is a signal for enabling the LLR sub-buffer #5 315-5 to write an LLR value. Bf0_d is equal to LLR0, Bf1_d is equal to LLR1, Bf2_d is equal to LLR2, Bf3_d is equal to LLR3, Bf4_d is equal to LLR4, and Bf5_d is equal to LLR5. An operation of the LLR buffer write controller 313 will be described in detail later.

If the buffering of the LLR values is ended, the deinterleaver 319 reads the LLR values buffered in the LLR buffer 315. The deinterleaver 319 outputs a desired deinterleaver address to the LLR buffer read controller 317. The LLR buffer read controller 317 outputs an LLR sub-buffer selection signal Buf_sel, a read address Bf_rd_adr, and a read enable signal Bf_rden to the LLR buffer 315 so that the LLR values buffered in the LLR buffer 315 can be output to the deinterleaver 319 according to the deinterleaver address desired in the deinterleaver. Herein, the memory addresses, which are output to read the LLR values, are converted into memory addresses of the LLR sub-buffers 315-0 to 315-5. Therefore, the LLR values desired by the deinterleaver 319 are output to the deinterleaver 319.

A description will now be made of an operation of the LLR demapper 311.

Figure 4:
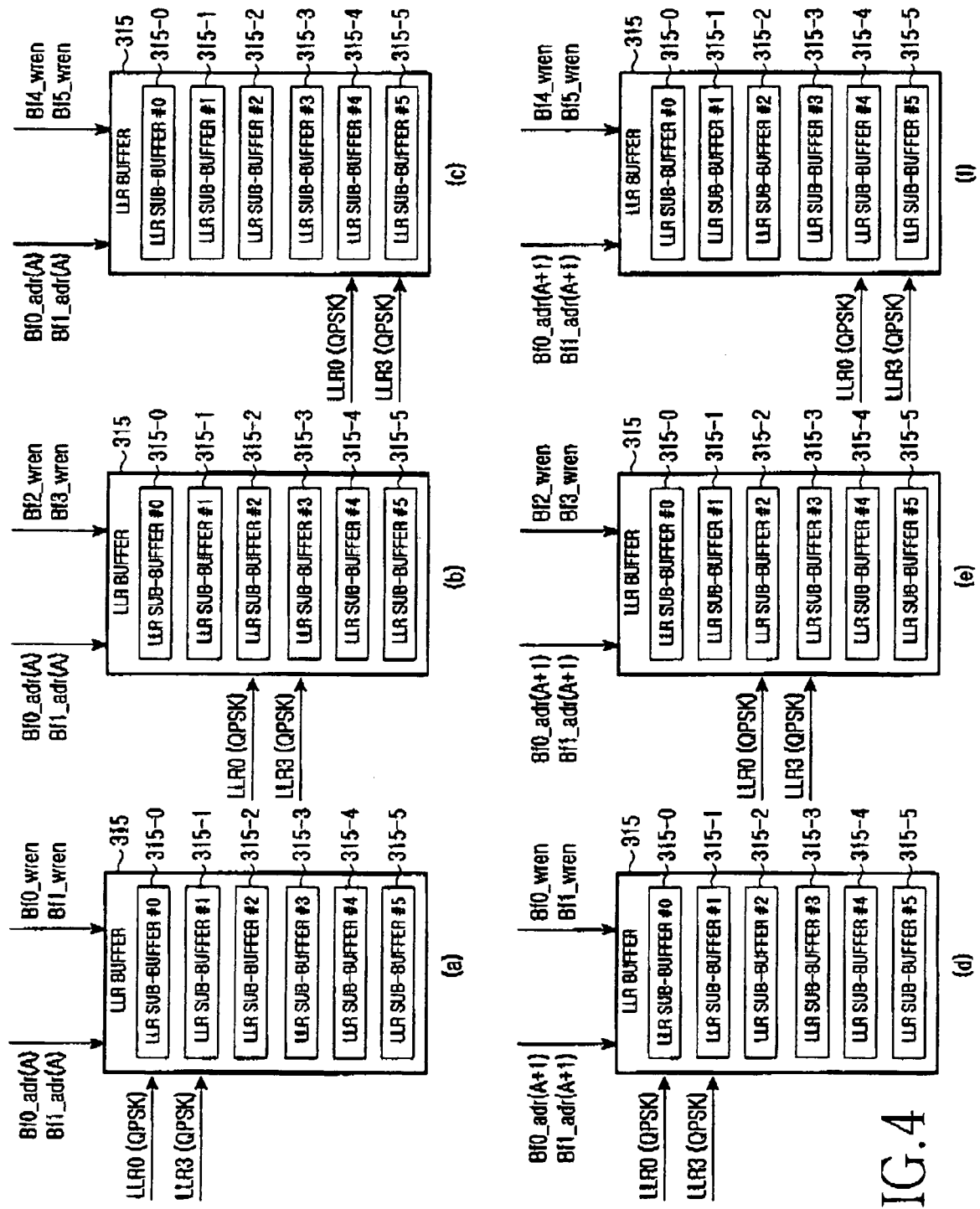
FIG. 4 is a diagram schematically illustrating an operation in which an LLR buffer write controller buffers the LLR values in an LLR buffer in the case where the LLR demapper of FIG. 3 uses a first demapping scheme.

First, with reference to FIG. 4, a description will be made of an operation of buffering the LLR values output from an LLR demapper 311 for the case where the LLR demapper 311 uses a first demapping scheme. FIG. 4 is a diagram schematically illustrating an operation in which an LLR buffer write controller 313 buffers the LLR values in an LLR buffer 315 in the case where the LLR demapper 311 of FIG. 3 uses the first demapping scheme.

Referring to FIG. 4, the LLR demapper 311, when it uses the first demapping scheme, outputs one LLR value for each of an I sub-carrier signal and a Q sub-carrier signal. A total of 2 LLR values output for each of the I sub-carrier signal and the Q sub-carrier signal are sequentially buffered in LLR sub-buffers 315-0 to 315-5 included in the LLR buffer 315. When buffering LLR values for a first I sub-carrier signal and Q sub-carrier signal generated using the first demapping scheme in the LLR buffer 315, the LLR buffer write controller 313 buffers them in the LLR sub-buffer #0 315-0 and the LLR sub-buffer #1 315-1, respectively, as shown in (a). When buffering LLR values for a second I sub-carrier signal and Q sub-carrier signal generated using the first demapping scheme in the LLR buffer 315, the LLR buffer write controller 313 buffers them in the LLR sub-buffer #2 315-2 and the LLR sub-buffer #3 315-3, respectively, as shown in (b). When buffering LLR values for a third I sub-carrier signal and Q sub-carrier signal generated using the first demapping scheme in the LLR buffer 315, the LLR buffer write controller 313 buffers them in the LLR sub-buffer #4 315-4 and the LLR sub-buffer #5 315-5, respectively, as shown in (c).

Therefore, an address where the first LLR value is buffered in each of the LLR sub-buffers 315-0 to 315-5 included in the LLR buffer 315 is identical. That is, as shown in (a) to (c), an address where the first LLR value is buffered in each of the LLR sub-buffers 315-0 to 315-5 is 'A'. In addition, when buffering LLR values for a fourth I sub-carrier signal and Q sub-carrier signal generated using the first demapping scheme in the LLR buffer 315, the LLR buffer write controller 313 buffers them again in the LLR sub-buffer #0 315-0 and the LLR sub-buffer #1 315-1, respectively, as shown in (d), and an address where the fourth LLR value is buffered is an address where a previous LLR value is buffered in the LLR sub-buffer #0 315-0 and the LLR sub-buffer #1 315-1, i.e., an address 'A+1' generated by adding, for example, I to a value previously set in A. In addition, when buffering LLR values for a fifth I sub-carrier signal and Q sub-carrier signal generated using the first demapping scheme in the LLR buffer 315, the LLR buffer write controller 313 buffers them again in the LLR sub-buffer #2 315-2 and the LLR sub-buffer #3 315-3, respectively, as shown in (e), and an address where the fifth LLR value is buffered is also 'A+1'. Also, when buffering an LLR value for the sixth I sub-carrier signal and an LLR value for the Q sub-carrier signal in the LLR buffer 315, the LLR buffer write controller 313 buffers them in the LLR sub-buffer #4 315-4 and the LLR sub-buffer #5 315-5 as shown in (f), and an address where the sixth LLR value is buffered is also 'A+1'. In FIG. 4, the operation of buffering LLR values for only up to the sixth I sub-carrier signal and Q sub-carrier signal has been described, by way of example. An operation of buffering the next LLR values is similar to the operation of buffering the LLR values for up to the sixth I sub-carrier signal and Q sub-carrier signal.

Figure 5:
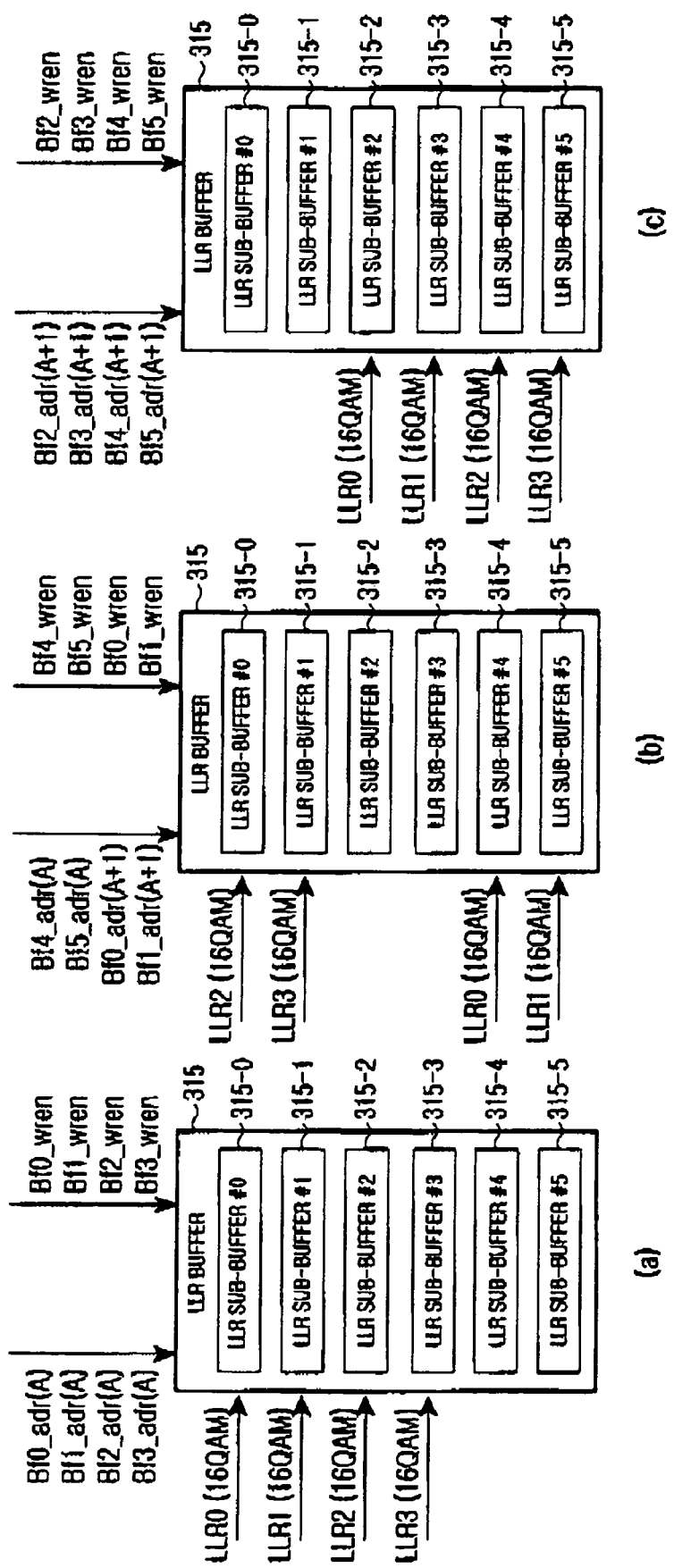
FIG. 5 is a diagram schematically illustrating an operation in which an LLR buffer write controller buffers the LLR values in an LLR buffer in the case where the LLR demapper of FIG. 3 uses a second demapping scheme.

Next, with reference to FIG. 5, a description will be made of an operation of buffering the LLR values output from the LLR demapper 311 for the case where the LLR demapper 311 uses a second demapping scheme. FIG. 5 is a diagram schematically illustrating an operation in which an LLR buffer write controller 313 buffers the LLR values in an LLR buffer 315 in the case where the LLR demapper 311 of FIG. 3 uses the second demapping scheme.

Referring to FIG. 5, the LLR demapper 311, when it uses the second demapping scheme, outputs two LLR values for each of an I sub-carrier signal and a Q sub-carrier signal. A total of 4 LLR values output for each of the I sub-carrier signal and the Q sub-carrier signal are sequentially buffered in LLR sub-buffers 315-0 to 315-5 included in the LLR buffer 315.

When buffering LLR values for a first I sub-carrier signal and Q sub-carrier signal generated using the second demapping scheme in the LLR buffer 315, the LLR buffer write controller 313 buffers them in the LLR sub-buffer #0 315-0 to the LLR sub-buffer #3 315-3, respectively, as shown in (a). In addition, when buffering LLR values for a second I sub-carrier signal and Q sub-carrier signal generated using the second demapping scheme in the LLR buffer 315, the LLR buffer write controller 313 buffers them in the LLR sub-buffer #0 315-0, the LLR sub-buffer #1 315-1, the LLR sub-buffer #4 315-4 and the LLR sub-buffer #5 315-5, respectively, as shown in (b). In addition, when buffering LLR values for a third I sub-carrier signal and Q sub-carrier signal generated using the second demapping scheme in the LLR buffer 315, the LLR buffer write controller 313 buffers them in the LLR sub-buffer #2 315-2 to the LLR sub-buffer #5 315-5, respectively, as shown in (c). Addresses where the LLR values are buffered in each LLR sub-buffer are shown in FIG. 5, and these are similar to those described in connection with FIG. 4, so a detailed description thereof will be omitted. In FIG. 5, the operation of buffering LLR values for only up to the third I sub-carrier signal and Q sub-carrier signal has been described, by way of example. An operation of buffering the next LLR values is similar to the operation of buffering the LLR values for up to the third I sub-carrier signal and Q sub-carrier signal.

Figure 6:
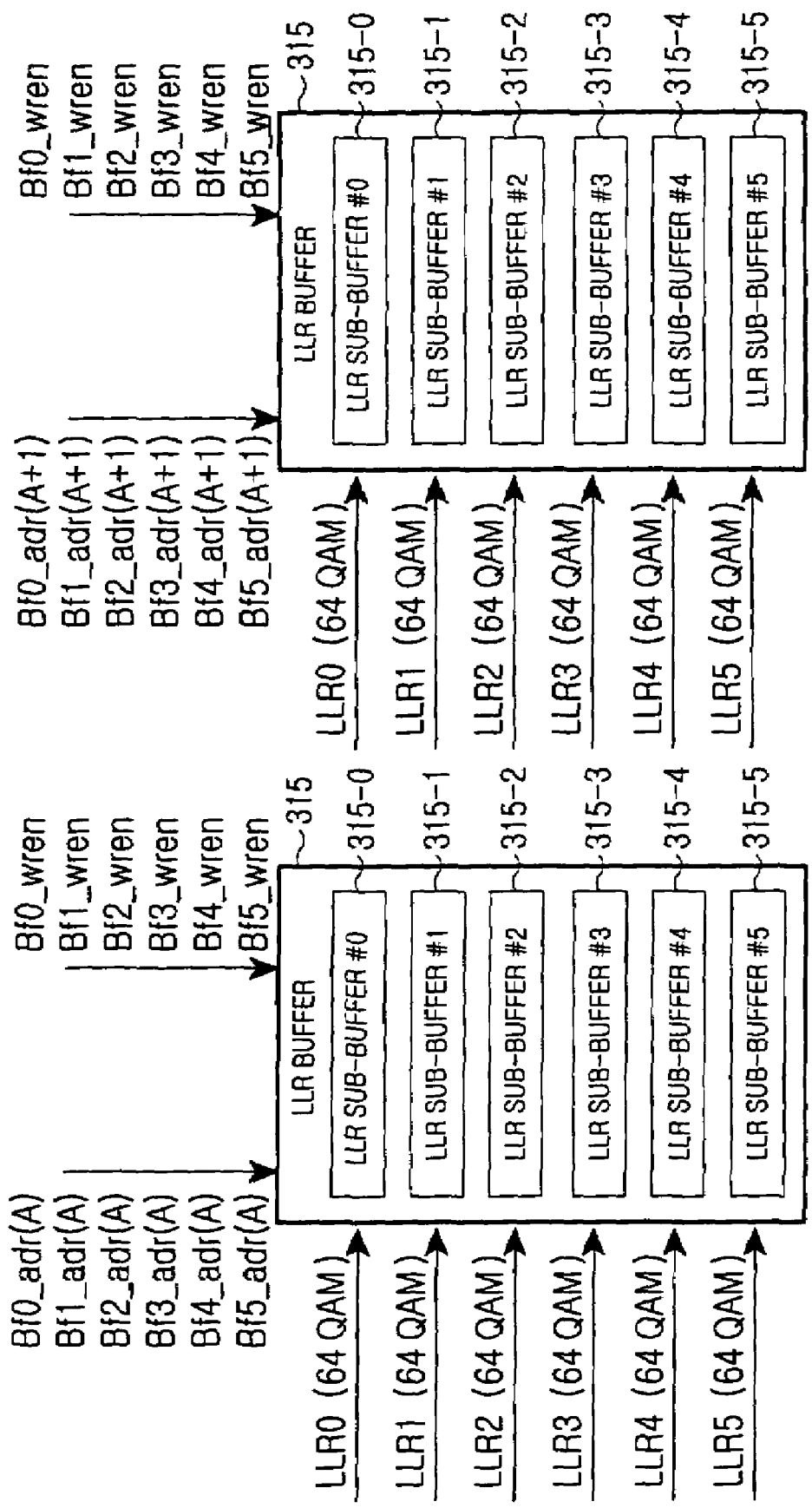
FIG. 6 is a diagram schematically illustrating an operation in which an LLR buffer write controller buffers the LLR values in an LLR buffer in the case where the LLR demapper of FIG. 3 uses a third demapping scheme.

Next, with reference to FIG. 6, a description will be made of an operation of buffering the LLR values output from the LLR demapper 311 for the case where the LLR demapper 311 uses a third demapping scheme. FIG. 6 is a diagram schematically illustrating an operation in which an LLR buffer write controller 313 buffers the LLR values in an LLR buffer 315 in the case where the LLR demapper 311 of FIG. 3 uses the third demapping scheme.

Referring to FIG. 6, the LLR demapper 311, when it uses the third demapping scheme, outputs three LLR values for each of an I sub-carrier signal and a Q sub-carrier signal. A total of 6 LLR values output for each of the I sub-carrier signal and the Q sub-carrier signal are sequentially buffered in LLR sub-buffers 315-0 to 315-5 included in the LLR buffer 315.

When buffering LLR values for a first I sub-carrier signal and Q sub-carrier signal generated using the third demapping scheme in the LLR buffer 315, the LLR buffer write controller 313 buffers them in the LLR sub-buffer #0 315-0 to the LLR sub-buffer #5 315-5, respectively, as shown in (a). In addition, when buffering LLR values for a second I sub-carrier signal and Q sub-carrier signal generated using the third demapping scheme in the LLR buffer 315, the LLR buffer write controller 313 buffers them in the LLR sub-buffer #0 315-0 to the LLR sub-buffer #5 315-5, respectively, as shown in (b). Addresses where the LLR values are buffered in each LLR sub-buffer are shown in FIG. 6, and these are similar to those described in connection with FIG. 4, so a detailed description thereof will be omitted. In FIG. 6, the operation of buffering LLR values for only up to the second I sub-carrier signal and Q sub-carrier signal has been described, by way of example. An operation of buffering the next LLR values is similar to the operation of buffering the LLR values for up to the second I sub-carrier signal and Q sub-carrier signal.

Figure 7:
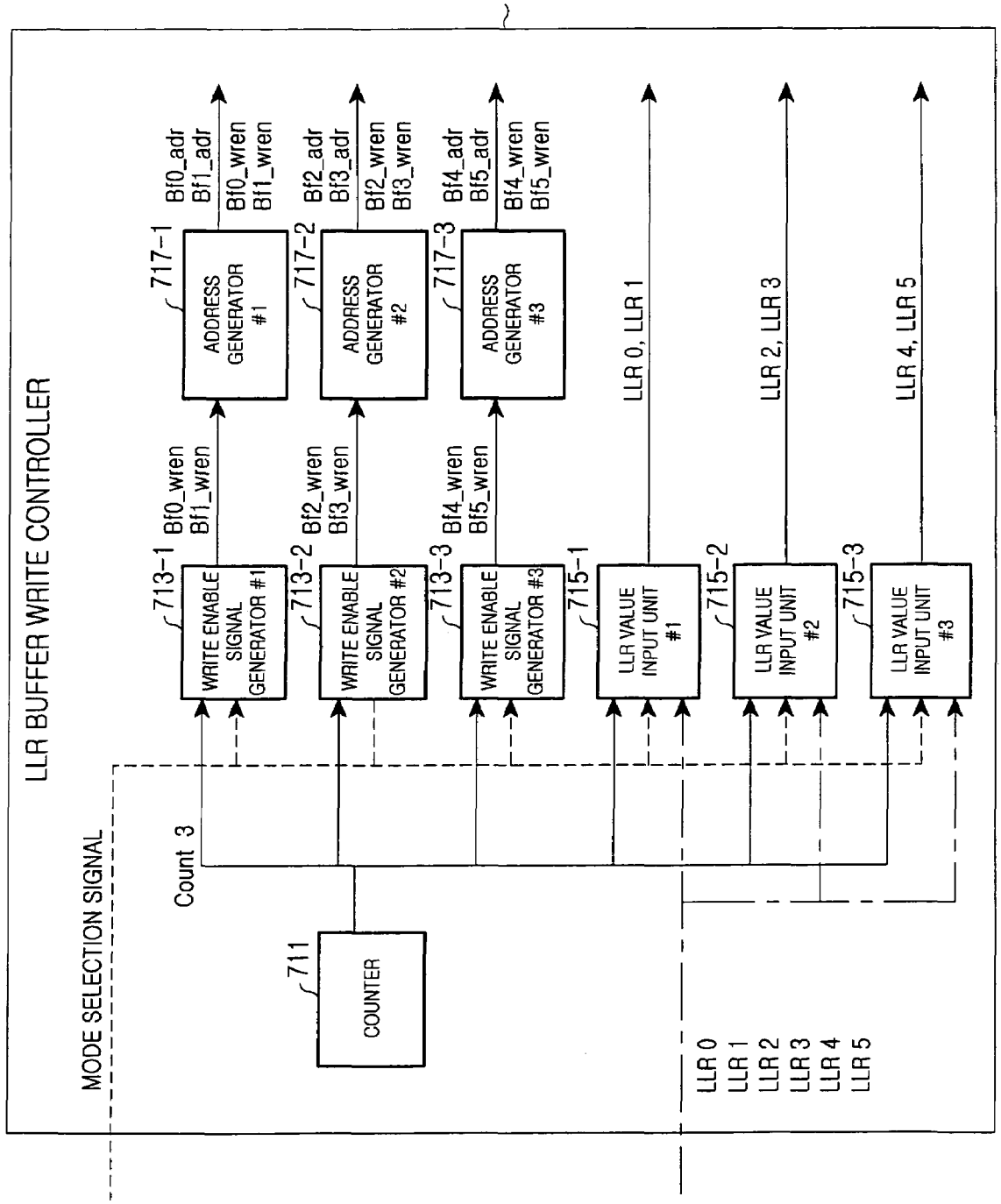
FIG. 7 is a diagram illustrating an internal structure of the LLR buffer write controller of FIG. 3.

The detailed exemplary structure of the LLR buffer write controller 313 for storing data in sub-buffers of an LLR buffer memory is illustrated in FIG. 7. FIG. 7 is a diagram illustrating an internal structure of the LLR buffer write controller 313 of FIG. 3.

Referring to FIG. 7, the LLR buffer write controller 313 includes a counter 711, three write enable signal generators of a write enable signal generator #1 713-1 to a write enable signal generator #3 713-3, three LLR value input units of an LLR value input unit #1 715-1 to an LLR value input unit #3 715-3, and three address generators of an address generator #1 717-1 to an address generator #3 717-3. As described with reference to FIGS. 4 to 6, because one pair of LLR sub-buffers among the LLR sub-buffers included in the LLR buffer 315 use the same address, the counter 711 increases a counter value each time LLR values are buffered in one pair of LLR sub-buffers, and the counter value is output to the write enable signal generators 713-1 to 713-3 and the LLR value input units 715-1 to 715-3. As described above, because one pair of LLR sub-buffers in the LLR buffer 315 use the same address, the LLR buffer write controller 313 includes three write enable signal generators, three LLR value input units, and three address generators. The write enable signal generators 713-1 to 713-3 are provided with a counter value output from the counter 711 and a mode selection signal. The write enable signal generators 713-1 to 713-3 are connected to the address generators 717-1 to 717-3, respectively. Upon receipt of the counter value and the mode selection signal, the write enable signal generators 713-1 to 713-3 generate write enable signals and output the write enable signals to the address generators 717-1 to 717-3, respectively. That is, each of the write enable signal generators 713-1 to 713-3 determines a time when it will buffer LLR values in an LLR sub-buffer pair corresponding to the counter value. For example, if the mode selection signal indicates a first demapping scheme and the counter value is '0', LLR values should be buffered in the LLR sub-buffer #0 315-0 and the LLR sub-buffer #1 315-1. Therefore, only the write enable signal generators 713-1 corresponding to the LLR sub-buffer #0 315-0 and the LLR sub-buffer #1 315-1 among the write enable signal generators 713-1 to 713-3 generates the write enable signal. The write enable signals generated from the write enable signal generators 713-1 to 713-3 are input to the address generators 717-1 to 717-3, respectively. Upon receipt of the write enable signals from the write enable signal generators 713-1 to 713-3, the address generators 717-1 to 717-3 generate addresses for buffering the LLR values. Because the LLR values are sequentially buffered in the LLR sub-buffers 315-1 to 315-3 included in the LLR buffer 315, the address generators 717-1 to 717-3 are realized with counters in the present invention. The address generators 717-1 to 717-3 count addresses of corresponding LLR sub-buffers each time LLR values are buffered in the corresponding LLR sub-buffers. The LLR value input units 715-1 to 715-3 output the input LLR values to the corresponding LLR sub-buffers according to the counter value output from the counter 711 and the mode selection signal.

The deinterleaver 319 reads the LLR values buffered in the LLR buffer 315. For that purpose, the deinterleaver 319 outputs its own desired deinterleaver address to the LLR buffer read controller 317. The LLR buffer read controller 317 outputs an LLR sub-buffer selection signal Buf_sel, a read address Bf_rd_adr, and a read enable signal Bf_rden to the LLR buffer 315 so that the LLR values buffered in the LLR buffer 315 according to the demapping scheme may be appropriately read.

The LLR buffer read controller 317, because it is realized with a total of 6 LLR sub-buffers, generates a read address in accordance with Equation (1) below, if the deinterleaver address is denoted by R.

$$\text{LLR sub-buffer address=positive integer quotient of } R/6 \qquad (1)$$

The LLR sub-buffer address in Equation (1) is commonly used for all LLR sub-buffers.

If the R/6 value calculated in Equation (1) is '0', an address of the LLR sub-buffer is '0', and if the R/6 value is '1', the address of the LLR sub-buffer is also '1'. The LLR buffer read controller 317 generates an LLR sub-buffer selection signal in accordance with Equation (2) below.

$$\text{LLR sub-buffer selection signal} = R\ \%6 \qquad (2)$$

In Equation (2), % denotes an operator for acquiring, as a result value, a remainder given after dividing a specific value by 6. In Equation (2), if the R %6 value is '0', i.e., if a value of the LLR sub-buffer selection signal output from the LLR buffer read controller 317 is '0', an LLR sub-buffer #0 315-0 is selected. If the value is '1', an LLR sub-buffer #1 315-1 is selected.

Meanwhile, in the present invention, due to the fixed size of the LLR buffer 315, a size of its memory address is also fixed (for example, when the decoder is realized with a CTC decoder, because its size is 960, a size of the memory address, needed to express the size of 960, is fixed to 10 bits). Further, because the divisor is fixed to 6, Equation (1) and Equation (2) can be transformed into Equation (3) and Equation (4) below using a table conversion method.

$$\text{Quotient of } R/6 = \text{'quotient of } R/3\text{'} *2 \text{ (replaced with shift operation)} \qquad (3)$$

$$\text{Remainder of } R\ \%6 = \text{'remainder of } R\ \%2\text{' } (LSB \text{ of input data}) + \text{'remainder of } \%3\text{'} *2 \text{ (replaced with shift operation)} \qquad (4)$$

In Equation (3), if the divisor is '6', it can be transformed into 'division by 3'. The reason for replacing it with 'division by 3' is because the table configuration is more simplified. A division-by-3 table method will be described below. First, 10 LSB bits of a deinterleaver address are separately stored. Herein, the LSB corresponds to the remainder of R %2. In the deinterleaver address, the remaining 9 bits except for the LSB are divided into three fields of [8:6], [5:3] and [2:0], forming a table. For [8:6], the table can be made as follows.

case ([8:6])
000: quotient 0, remainder 0
001: quotient 21, remainder 1
010: quotient 42, remainder 2
...
111: quotient 149, remainder 1
endcase In this way, quotients and remainders are calculated for each of the three fields of [8:6], [5:3] and [2:0]. As a result, 3 quotients and 3 remainders are obtained, and the remainders should be processed once more. Assuming that the 3 remainders are A, B and C, the actual remainder can be represented by Equation (5):

$$\text{Remainder } Y \text{ of division by } 3 = (A+B+C)\%3$$

$$\text{Additional quotient } X = (A+B+C)/3 \qquad (5)$$

Equation (5) can also be realized with the table method. Therefore, the final result of division/remainder by 3 can be represented by Equation (6) below. It is assumed in Equation (6) that the 3 quotients are E, F and G.

$$\text{Value of } R/3 = E+F+G+X$$

$$\text{Value of }\%3 = Y \qquad (6)$$

Based on the above result values, the final result of division/remainder by 6 can be obtained using the previously stored LSB result, Equation (3) and Equation (4). The use of this method causes a 3-clock pipeline delay. In this case, however, it is possible to consecutively read data after a delay of the first 3 clocks, giving inconsiderable influence to the overall performance.

As can be understood from the foregoing description, the present invention prevents the delay occurring when LLR values are buffered in an LLR buffer, thereby contributing to the prevention of deterioration in the overall system performance. In addition, the present invention can buffer LLR values in the LLR buffer without an additional increase in memory size to prevent the delay, also contributing to the prevention of a reduction in memory resource efficiency.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for receiving a signal in a communication system, the apparatus comprising:
  a log-likelihood ratio (LLR) buffer with a plurality of LLR sub-buffers, for buffering an LLR value generated according to each of a plurality of demapping schemes;
  an LLR demapper for generating a particular LLR value by demapping an input signal according to a particular demapping scheme among the plurality of demapping schemes;
  an LLR buffer write controller for performing a control operation of buffering the particular LLR value in a particular LLR sub-buffer for buffering an LLR value generated according to the particular demapping scheme among the plurality of LLR sub-buffers; and
  an LLR buffer read controller for performing a control operation of reading an LLR value buffered in the LLR buffer.

2. The apparatus of claim 1, wherein the LLR buffer write controller generates a write enable signal indicative of a signal for write-enabling an LLR sub-buffer scheduled to buffer the particular LLR value therein among the plurality of LLR sub-buffers, and an address for buffering the particular LLR value in the write-enabled LLR sub-buffer.

3. The apparatus of claim 1, wherein the LLR buffer comprises two sub-buffers when an input data mode is a quadrature phase shift keying (QPSK) mode.

4. The apparatus of claim 1, wherein the demapping schemes include a first demapping scheme corresponding to QPSK, a second demapping scheme corresponding to 16-ary quadrature amplitude modulation (16QAM), and a third demapping scheme corresponding to 64QAM.

5. The apparatus of claim 4, wherein if the input signal includes an in-phase (I) sub-carrier signal and a quadrature-phase (Q) sub-carrier signal, the particular LLR value includes a first particular LLR value generated by demapping the I sub-carrier signal according to the particular demapping scheme, and a second particular LLR value generated by demapping the Q sub-carrier signal according to the particular demapping scheme; and
  wherein if the particular demapping scheme is the first demapping scheme, the first particular LLR value includes a first LLR value, and the second particular LLR value includes a second LLR value, wherein if the particular demapping scheme is the second demapping scheme, the first particular LLR value includes the first LLR value and a third LLR value, and the second particular LLR value includes the second LLR value and a fourth LLR value, wherein if the particular demapping scheme is the third demapping scheme, the first particular LLR value includes the first LLR value, the third LLR value and a fifth LLR value, and the second particular LLR value includes the second LLR value, the fourth LLR value and a sixth LLR value.

6. The apparatus of claim 5, wherein the LLR sub-buffers include a first LLR sub-buffer, a second LLR sub-buffer, a third LLR sub-buffer, a fourth LLR sub-buffer, a fifth LLR sub-buffer, and a sixth LLR sub-buffer.

7. The apparatus of claim 6, wherein if the particular demapping scheme is the first demapping scheme, the LLR buffer write controller performs a control operation of sequentially buffering the first LLR value and the second LLR value in the first LLR sub-buffer to the sixth LLR sub-buffer.

8. The apparatus of claim 6, wherein if the particular demapping scheme is the first demapping scheme, the LLR buffer write controller performs a control operation of:
  buffering, for a first input signal, the first LLR value in an address A of the first LLR sub-buffer, and buffering the second LLR value in an address A of the second LLR sub-buffer;
  buffering, for a second input signal, the first LLR value in an address A of the third LLR sub-buffer, and buffering the second LLR value in an address A of the fourth LLR sub-buffer;
  buffering, for a third input signal, the first LLR value in an address A of the fifth LLR sub-buffer, and buffering the second LLR value in an address A of the sixth LLR sub-buffer;
  buffering, for a fourth input signal, the first LLR value in an address A+K of the first LLR sub-buffer, and buffering the second LLR value in an address A+K of the second LLR sub-buffer;
  buffering, for a fifth input signal, the first LLR value in an address A+K of the third LLR sub-buffer, and buffering the second LLR value in an address A+K of the fourth LLR sub-buffer; and
  buffering, for a sixth input signal, the first LLR value in an address A+K of the fifth LLR sub-buffer, and buffering the second LLR value in an address A+K of the sixth LLR sub-buffer.

9. The apparatus of claim 6, wherein if the particular demapping scheme is the second demapping scheme, the LLR buffer write controller performs a control operation of sequentially buffering the first LLR value to the fourth LLR value in the first LLR sub-buffer to the sixth LLR sub-buffer.

10. The apparatus of claim 6, wherein if the particular demapping scheme is the second demapping scheme, the LLR buffer write controller performs a control operation of:
  buffering, for a first input signal, the first LLR value in an address A of the first LLR sub-buffer, buffering the second LLR value in an address A of the second LLR sub-buffer, buffering the third LLR value in an address A of the third LLR sub-buffer, and buffering the fourth LLR value in an address A of the fourth LLR sub-buffer;
  buffering, for a second input signal, the first LLR value in an address A of the fifth LLR sub-buffer, buffering the second LLR value in an address A of the sixth LLR sub-buffer, buffering the third LLR value in an address A+K of the first LLR sub-buffer, and buffering the fourth LLR value in an address A+K of the second LLR sub-buffer; and
  buffering, for a third input signal, the first LLR value in an address A+K of the third LLR sub-buffer, buffering the second LLR value in an address A+K of the fourth LLR sub-buffer, buffering the third LLR value in an address A+K of the fifth LLR sub-buffer, and buffering the fourth LLR value in an address A+K of the sixth LLR sub-buffer.

11. The apparatus of claim 6, wherein if the particular demapping scheme is the third demapping scheme, the LLR buffer write controller performs a control operation of sequentially buffering the first LLR value to the sixth LLR value in the first LLR sub-buffer to the sixth LLR sub-buffer.

12. The apparatus of claim 6, wherein if the particular demapping scheme is the third demapping scheme, the LLR buffer write controller performs a control operation of buffering the first LLR value in the first LLR sub-buffer, buffering the second LLR value in the second LLR sub-buffer, buffering the third LLR value in the third LLR sub-buffer, buffering the fourth LLR value in the fourth LLR sub-buffer, buffering the fifth LLR value in the fifth LLR sub-buffer, and buffering the sixth LLR value in the sixth LLR sub-buffer.

13. The apparatus of claim 6, wherein the LLR buffer read controller generates an LLR sub-buffer selection signal for selecting an LLR sub-buffer scheduled to read the first LLR value and the second LLR value according to a deinterleaver address provided from a deinterleaver, and an LLR sub-buffer address for reading the first LLR value and the second LLR value from the selected LLR sub-buffer.

14. The apparatus of claim 6, wherein the LLR buffer read controller generates the LLR sub-buffer address according to LLR sub-buffer address=positive integer quotient of R/6 where R is a deinterleaver address.

15. The apparatus of claim 14, wherein the LLR buffer read controller generates the LLR sub-buffer selection signal according to LLR sub-buffer selection signal=R % 6 where % denotes an operator for acquiring, as a result value, a remainder given after dividing a specific value by 6.

16. A method for receiving a signal in a communication system, the method comprising the steps of:
generating a particular log-likelihood ratio (LLR) value by demapping an input signal according to a particular demapping scheme among a plurality of demapping schemes;
performing a control operation of buffering the particular LLR value in a particular LLR sub-buffer for buffering an LLR value generated according to the particular demapping scheme among the plurality of LLR sub-buffers for buffering an LLR value generated according to each of the plurality of demapping schemes; and
performing a control operation of reading an LLR value buffered in an LLR buffer including the plurality of LLR sub-buffers.

17. The method of claim 16, wherein the step of performing a control operation of buffering the particular LLR value in a particular LLR sub-buffer comprises generating a write enable signal indicative of a signal for write-enabling an LLR sub-buffer scheduled to buffer the particular LLR value therein among the plurality of LLR sub-buffers, and an address for buffering the particular LLR value in the write-enabled LLR sub-buffer.

18. The method of claim 16, wherein the step of performing a control operation of reading an LLR value comprises generating an LLR sub-buffer selection signal for selecting an LLR sub-buffer scheduled to read an LLR value among the plurality of LLR sub-buffers according to a read address desired to read an LLR value buffered in the LLR buffer, and an address for reading an LLR value buffered in the selected LLR sub-buffer.

19. The method of claim 16, wherein the demapping schemes include a first demapping scheme corresponding to quadrature phase shift keying (QPSK), a second demapping scheme corresponding to 16-ary quadrature amplitude modulation (16QAM), and a third demapping scheme corresponding to 64QAM.

20. The method of claim 19, wherein if the input signal includes an in-phase (I) sub-carrier signal and a quadrature-phase (Q) sub-carrier signal, the particular LLR value includes a first particular LLR value generated by demapping the I sub-carrier signal according to the particular demapping scheme, and a second particular LLR value generated by demapping the Q sub-carrier signal according to the particular demapping scheme;
wherein if the particular demapping scheme is the first demapping scheme, the first particular LLR value includes a first LLR value, and the second particular LLR value includes a second LLR value;
wherein if the particular demapping scheme is the second demapping scheme, the first particular LLR value includes the first LLR value and a third LLR value, and the second particular LLR value includes the second LLR value and a fourth LLR value;
wherein if the particular demapping scheme is the third demapping scheme, the first particular LLR value includes the first LLR value, the third LLR value and a fifth LLR value, and the second particular LLR value includes the second LLR value, the fourth LLR value and a sixth LLR value.

21. The method of claim 20, wherein the LLR sub-buffers include a first LLR sub-buffer, a second LLR sub-buffer, a third LLR sub-buffer, a fourth LLR sub-buffer, a fifth LLR sub-buffer, and a sixth LLR sub-buffer.

22. The method of claim 21, wherein the step of performing a control operation of buffering the particular LLR value in a particular LLR sub-buffer comprises, if the particular demapping scheme is the first demapping scheme, performing a control operation of sequentially buffering the first LLR value and the second LLR value in the first LLR sub-buffer to the sixth LLR sub-buffer.

23. The method of claim 21, wherein the step of performing a control operation of buffering the particular LLR value in a particular LLR sub-buffer comprises, if the particular demapping scheme is the first demapping scheme, performing a control operation of:
buffering, for a first input signal, the first LLR value in an address A of the first LLR sub-buffer, and buffering the second LLR value in an address A of the second LLR sub-buffer;
buffering, for a second input signal, the first LLR value in an address A of the third LLR sub-buffer, and buffering the second LLR value in an address A of the fourth LLR sub-buffer;
buffering, for a third input signal, the first LLR value in an address A of the fifth LLR sub-buffer, and buffering the second LLR value in an address A of the sixth LLR sub-buffer;
buffering, for a fourth input signal, the first LLR value in an address A+K of the first LLR sub-buffer, and buffering the second LLR value in an address A+K of the second LLR sub-buffer;
buffering, for a fifth input signal, the first LLR value in an address A+K of the third LLR sub-buffer, and buffering the second LLR value in an address A+K of the fourth LLR sub-buffer; and
buffering, for a sixth input signal, the first LLR value in an address A+K of the fifth LLR sub-buffer, and buffering the second LLR value in an address A+K of the sixth LLR sub-buffer.

24. The method of claim 21, wherein the step of performing a control operation of buffering the particular LLR value in a particular LLR sub-buffer comprises, if the particular demapping scheme is the second demapping scheme, performing a control operation of sequentially buffering the first LLR value to the fourth LLR value in the first LLR sub-buffer to the sixth LLR sub-buffer.

25. The method of claim 21, wherein the step of performing a control operation of buffering the particular LLR value in a particular LLR sub-buffer comprises, if the particular demapping scheme is the second demapping scheme, performing a control operation of:
  buffering, for a first input signal, the first LLR value in an address A of the first LLR sub-buffer, buffering the second LLR value in an address A of the second LLR sub-buffer, buffering the third LLR value in an address A of the third LLR sub-buffer, and buffering the fourth LLR value in an address A of the fourth LLR sub-buffer;
  buffering, for a second input signal, the first LLR value in an address A of the fifth LLR sub-buffer, buffering the second LLR value in an address A of the sixth LLR sub-buffer, buffering the third LLR value in an address A+K of the first LLR sub-buffer, and buffering the fourth LLR value in an address A+K of the second LLR sub-buffer; and
  buffering, for a third input signal, the first LLR value in an address A+K of the third LLR sub-buffer, buffering the second LLR value in an address A+K of the fourth LLR sub-buffer, buffering the third LLR value in an address A+K of the fifth LLR sub-buffer, and buffering the fourth LLR value in an address A+K of the sixth LLR sub-buffer.

26. The method of claim 21, wherein the step of performing a control operation of buffering the particular LLR value in a particular LLR sub-buffer comprises, if the particular demapping scheme is the third demapping scheme, performing a control operation of sequentially buffering the first LLR value to the sixth LLR value in the first LLR sub-buffer to the sixth LLR sub-buffer.

27. The method of claim 21, wherein the step of performing a control operation of buffering the particular LLR value in a particular LLR sub-buffer comprises, if the particular demapping scheme is the third demapping scheme, performing a control operation of buffering the first LLR value in the first LLR sub-buffer, buffering the second LLR value in the second LLR sub-buffer, buffering the third LLR value in the third LLR sub-buffer, buffering the fourth LLR value in the fourth LLR sub-buffer, buffering the fifth LLR value in the fifth LLR sub-buffer, and buffering the sixth LLR value in the sixth LLR sub-buffer.

28. The method of claim 21, wherein the step of performing a control operation of reading an LLR value comprises generating an LLR sub-buffer selection signal for selecting an LLR sub-buffer scheduled to read the first LLR value and the second LLR value according to a deinterleaver address provided from a deinterleaver, and an LLR sub-buffer address for reading the first LLR value and the second LLR value from the selected LLR sub-buffer.

29. The method of claim 21, wherein the step of performing a control operation of reading an LLR value comprises generating the LLR sub-buffer address according to:
  LLR sub-buffer address=positive integer quotient of $R/6$ where R is a deinterleaver address.

30. The method of claim 29, wherein performing a control operation of reading an LLR value comprises the step of generating the LLR sub-buffer selection signal according to:
  LLR sub-buffer selection signal=R % 6 where % denotes an operator for acquiring, as a result value, a remainder given after dividing a specific value by 6.

* * * * *

UNITED STATES PATENT AND TRADEMARK OFFICE
CERTIFICATE OF CORRECTION

| | |
|---|---|
| PATENT NO. | : 7,594,160 B2 |
| APPLICATION NO. | : 11/450815 |
| DATED | : September 22, 2009 |
| INVENTOR(S) | : Cho et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 748 days.

Signed and Sealed this

Twenty-eighth Day of September, 2010

David J. Kappos
*Director of the United States Patent and Trademark Office*